(12) United States Patent
Bauer

(10) Patent No.: US 6,798,270 B1
(45) Date of Patent: Sep. 28, 2004

(54) PASS GATE MULTIPLEXER CIRCUIT WITH REDUCED SUSCEPTIBILITY TO SINGLE EVENT UPSETS

(75) Inventor: Trevor J. Bauer, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/618,039

(22) Filed: Jul. 11, 2003

Related U.S. Application Data

(62) Division of application No. 10/172,836, filed on Jun. 13, 2002, now Pat. No. 6,617,912.

(51) Int. Cl.[7] ........................ H03K 17/687; H03K 17/16
(52) U.S. Cl. ....................................... 327/408; 326/113
(58) Field of Search ................................ 327/407, 408, 327/411, 566, 594, 595; 326/39–41, 113; 365/189.02

(56) References Cited

U.S. PATENT DOCUMENTS

| | | | |
|---|---|---|---|
| 4,985,647 A | 1/1991 | Kawada | |
| 5,352,940 A | 10/1994 | Watson | |
| 5,646,558 A | 7/1997 | Jamshidi | |
| 5,760,604 A | 6/1998 | Pierce et al. | |
| 5,962,881 A | 10/1999 | Young | |
| 6,278,290 B1 | 8/2001 | Young | |
| 6,363,019 B1 | 3/2002 | Erickson et al. | |
| 6,380,765 B1 | 4/2002 | Forbes et al. | |
| 6,617,912 B1 | * 9/2003 | Bauer | 327/408 |
| 6,671,202 B1 | * 12/2003 | Bauer | 365/154 |

* cited by examiner

*Primary Examiner*—Timothy P. Callahan
*Assistant Examiner*—Terry L. Englund
(74) *Attorney, Agent, or Firm*—Lois D. Cartier

(57) ABSTRACT

A multiplexer circuit for programmable logic devices (PLDs) has reduced susceptibility to single event upsets. The pass gate multiplexer circuit has 2N pass gates and N memory cells controlling the pass gates. Each path between an input terminal and the output node includes two pass gates controlled by different memory cells. Therefore, a single event upset that inadvertently enables a pass gate can only short two input terminals when the other pass gate in the affected input path is also enabled by its associated memory cell. Therefore, the multiplexer circuit with two pass gates in each input path reduces the susceptibility to single event upsets by a factor of (N−4)/N.

7 Claims, 3 Drawing Sheets

PASS GATE MULTIPLEXER CIRCUIT WITH REDUCED SUSCEPTIBILITY TO SINGLE EVENT UPSETS

This application is a divisional of 10/172,836 filed Jun. 13, 2002 now U.S. Pat. No. 6,617,912.

FIELD OF THE INVENTION

The invention relates to pass gate multiplexer circuits susceptible to single event upsets, such as those in programmable logic devices (PLDs). More particularly, the invention relates to pass gate multiplexer circuits on which single event upsets have a reduced impact.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). Some FPGAs also include additional logic blocks with special purposes (e.g., DLLs, RAM, and so forth).

The various logic blocks are interconnected by a programmable interconnect structure that includes a large number of programmable interconnect lines (e.g., metal wires). The interconnect lines and logic blocks are interconnected using programmable interconnect points (PIPs). A PIP can be, for example, a pass gate. When the pass gate is turned on, the two nodes on either side of the pass gate are electrically connected. When the pass gate is turned off, the two nodes are isolated from each other. Thus, by controlling the values on the gate terminals of the pass gates, circuit connections can easily be made and altered.

The logic blocks and PIPs in a PLD are typically programmed (configured) by loading configuration data into thousands of configuration memory cells. In Field Programmable Gate Arrays (FPGAs), for example, each configuration memory cell is implemented as a static RAM cell. These static RAM cells are used, for example, to control the gate terminals of pass gates between pairs of interconnect lines.

When subjected to unusual conditions such as cosmic rays or bombardment by neutrons or alpha particles, a static RAM cell can change state. For example, a stored high value can be inadvertently changed to a low value, and vice versa. Sometimes these "single event upsets" have no effect on the functionality of the chip, for example, when the static RAM cell controls a pass gate between two unused interconnect lines. At other times, a single event upset can change the functionality of a configured PLD such that the circuit no longer functions properly.

FIG. 1 shows an exemplary PLD circuit that is subject to the effects of single event upsets. The circuit of FIG. 1 is a multiplexer circuit that includes several pass gates. This type of circuit is commonly included in FPGA interconnect structures, for example. The circuit selects one of several different input signals and passes the selected signal to an output node.

The circuit of FIG. 1 includes eight input terminals IN0–IN7 and eight pass gates 100–107 that selectively pass one of signals IN0–IN7, respectively, to an internal node INT. (In the present specification, the same reference characters are used to refer to terminals, signal lines, and their corresponding signals.) The signal on internal node INT is buffered by buffer BUF to provide output signal OUT. Buffer BUF, for example, can include two inverters 111, 112 coupled in series, and a pull up (e.g., a P-channel transistor 113 to power high VDD) on internal node INT and driven by the node between the two inverters. However, buffer BUF can be implemented in many different ways.

Each pass gate 100–107 has a gate terminal driven by a memory cell M0–M7, respectively. Each memory cell can include two cross-coupled inverters An, Bn, for example. However, memory cell M0–M7 can also be implemented in many different ways. For example, configuration memory cells in FPGAs typically include configuration logic for loading the configuration data. The details of memory cells M0–M7 are omitted, for clarity.

The multiplexer circuit of FIG. 1 operates as shown in Table 1. At most, one of memory cells M0–M7 can be configured with a high value at any given time. Other configurations are not supported by the circuit. As shown in Table 1, the one memory cell with a high value selects the associated input signal IN0–IN7 to be passed to internal node INT, and hence to output node OUT. If none of memory cells M0–M7 is configured with a high value, output signal OUT is held at its initial high value by pullup 113.

TABLE 1

| M7 | M6 | M5 | M4 | M3 | M2 | M1 | M0 | OUT |
|---|---|---|---|---|---|---|---|---|
| 0 | 0 | 0 | 0 | 0 | 0 | 0 | 0 | High |
| 0 | 0 | 0 | 0 | 0 | 0 | 0 | 1 | IN0 |
| 0 | 0 | 0 | 0 | 0 | 0 | 1 | 0 | IN1 |
| 0 | 0 | 0 | 0 | 0 | 1 | 0 | 0 | IN2 |
| 0 | 0 | 0 | 0 | 1 | 0 | 0 | 0 | IN3 |
| 0 | 0 | 0 | 1 | 0 | 0 | 0 | 0 | IN4 |
| 0 | 0 | 1 | 0 | 0 | 0 | 0 | 0 | IN5 |
| 0 | 1 | 0 | 0 | 0 | 0 | 0 | 0 | IN6 |
| 1 | 0 | 0 | 0 | 0 | 0 | 0 | 0 | IN7 |

In the multiplexer circuit of FIG. 1, the upset of any single memory cell (i.e., any single event upset affecting any of memory cells M0–M7) causes a failure in the circuit. For example, assume that memory cell M0 stores a high value, while memory cells M1–M7 store low values. Pass gate 100 is enabled, and the selected input signal is IN0. Pass gates 101–107 are disabled. If the value in memory cell M4 is upset (i.e., changes to a high value), pass gate 104 is enabled and there is a "short" (an inadvertent coupling) between input terminals IN0 and IN4. Similarly, if the value in memory cell M5 is upset, pass gate 105 is enabled and there is a short between nodes IN0 and IN5, and so forth. If the value in memory cell M0 is upset (i.e., changes to a low value), the path from input terminal IN0 to output terminal OUT is broken, and output signal OUT is no longer actively driven by node IN0.

Thus, the multiplexer structure of FIG. 1 is susceptible to single event upsets. Further, as operating voltages diminish, static RAM cells become more susceptible to changes in state caused by single event upsets. To reduce manufacturing costs, PLD manufacturers are aggressively reducing device sizes in their PLDs. These smaller devices often operate at lower voltages. Therefore, the effects of single event upsets are becoming more important over time. It is desirable to provide PLD circuits with reduced susceptibility to single event upsets, particularly commonly-used circuits such as multiplexing circuits.

SUMMARY OF THE INVENTION

The invention provides multiplexer circuits for programmable logic devices (PLDS) that have reduced susceptibility to single event upsets. A standard pass gate multiplexer circuit having N pass gates and N memory cells controlling the pass gates is modified to include an additional N pass gates, one on each input path. Thus, each path between an input terminal and the output node includes two pass gates controlled by different memory cells.

Therefore, a single event upset that inadvertently enables a pass gate can only short together two input terminals when the other pass gate in the affected input path is also enabled by its associated memory cell. Hence, an upset in any one of four memory cells still creates a circuit error. (The four pass gates that can create a circuit error are the two on the selected input path, which should be enabled, and two that should be disabled that are coupled in series with two other pass gates sharing memory cells with the pass gates on the selected path.) Therefore, the multiplexer circuit of the invention reduces the susceptibility to single event upsets by a factor of (N–4)/N.

A first multiplexer circuit according to the invention includes N input circuits, N memory cells susceptible to single event upsets, and an output node. N is an integer greater than four. Each input circuit includes an input terminal, a first pass gate coupled to the first input terminal, a second pass gate coupled to the first pass gate, and an output terminal coupled to the second pass gate. The output node is coupled to each output terminal of the N input circuits. Each of the N memory cells is coupled to the gate terminal of a pass gate in each of two different input circuits.

Some embodiments also include an output buffer coupled to the output node. In some embodiments, N is eight. In some embodiments, the pass gates are implemented as N-channel transistors.

A second multiplexer circuit according to the invention includes N input terminals, an output node, N first pass gates coupled between the N input terminals and the output node, and N second pass gates. N is an integer greater than four. Each second pass gate is coupled in series with one of the N first pass gates to form a pass gate pair. Each of the N memory cells is coupled to gate terminals of one of the N first pass gates and one of the N second pass gates. Each pass gate pair includes two pass gates having gate terminals coupled to different ones of the N memory cells.

A third embodiment of the invention is a system controlled by memory cells susceptible to single event upsets. The system includes programmable logic blocks, interconnect lines, and multiplexer circuits programmably coupling the interconnect lines to each other and to the logic blocks. Each multiplexer circuit includes the elements and circuit configuration described above with reference to the second multiplexer circuit.

In one embodiment, the system is a programmable logic device (PLD). In one such embodiment, the PLD is a field programmable gate array (FPGA) and the memory cells are configuration memory cells containing configuration data for the FPGA.

BRIEF DESCRIPTION OF THE DRAWINGS

The present invention is illustrated by way of example, and not by way of limitation, in the following figures.

DETAILED DESCRIPTION OF THE DRAWINGS

Figure 2:
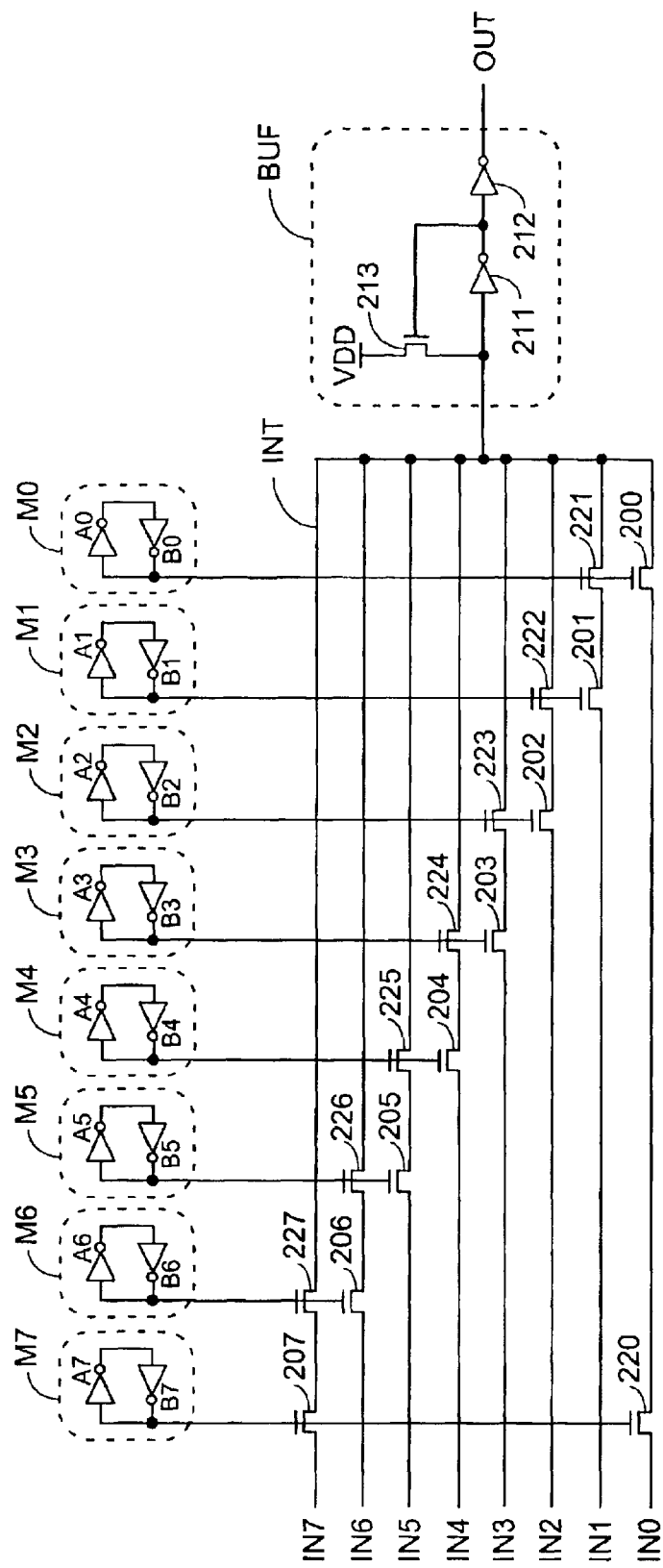
FIG. 2 shows a pass gate multiplexer circuit according to one embodiment of the invention.

FIG. 2 shows a multiplexer circuit with reduced susceptibility to single event upsets according to one embodiment of the invention. The circuit of FIG. 2 includes eight input terminals IN0–IN7, eight first pass gates 200–207, and eight second pass gates 220–227. The first and second pass gates are coupled together in pairs (200 and 220, 201 and 221, . . . , 207 and 227) that selectively pass one of the input signals (IN0, IN1, . . . , IN7, respectively) to an internal node INT. The signal on internal node INT is buffered by buffer BUF to provide output signal OUT.

Buffer BUF, for example, can include two inverters 211, 212 coupled in series, and a pull up (e.g., an N-channel transistor 213 to power high VDD) on internal node INT and driven by the node between the two inverters. However, buffer BUF can be implemented in many different ways.

Each pass gate 200–207, 220–227 has a gate terminal driven by a memory cell (M0–M7, M7, M0–M6, respectively). Each memory cell can include two cross-coupled inverters An, Bn, for example. However, memory cell M0–M7 can also be implemented in many different ways. For example, configuration memory cells in FPGA typically include configuration logic for loading the configuration data. The details of memory cells M0–M7 are omitted, for clarity.

The multiplexer circuit of FIG. 2 operates as shown in Table 2. Either two or zero of memory cells M0–M7 are preferably configured with a high value at any given time. As shown in Table 2, the two memory cells with high values select the associated input signal IN0–IN7 to be passed to internal node INT, and hence to output node OUT. If none of memory cells M0–M7 is configured with a high value, output signal OUT is held at its initial high value by pullup 113.

TABLE 2

| M7 | M6 | M5 | M4 | M3 | M2 | M1 | M0 | OUT |
|----|----|----|----|----|----|----|----|-----|
| 0  | 0  | 0  | 0  | 0  | 0  | 0  | 0  | High |
| 1  | 0  | 0  | 0  | 0  | 0  | 0  | 1  | IN0 |
| 0  | 0  | 0  | 0  | 0  | 0  | 1  | 1  | IN1 |
| 0  | 0  | 0  | 0  | 0  | 1  | 1  | 0  | IN2 |
| 0  | 0  | 0  | 0  | 1  | 1  | 0  | 0  | IN3 |
| 0  | 0  | 0  | 1  | 1  | 0  | 0  | 0  | IN4 |
| 0  | 0  | 1  | 1  | 0  | 0  | 0  | 0  | IN5 |
| 0  | 1  | 1  | 0  | 0  | 0  | 0  | 0  | IN6 |
| 1  | 1  | 0  | 0  | 0  | 0  | 0  | 0  | IN7 |

In the multiplexer circuit of FIG. 2, the upset of a single memory cell (i.e., any single event upset affecting any of memory cells M0–M7) might or might not cause a failure in the circuit. For example, assume that memory cells M0 and M7 store high values, while memory cells M1–M6 store low values. Pass gates 207, 220, 221, and 200 are enabled, and the selected input signal is IN0. All other illustrated pass gates are disabled.

If the value in memory cell M6 is upset (i.e., changes to a high value), pass gate 227 is enabled and there is a short between input terminals IN0 and IN7. Similarly, if the value in memory cell M1 is upset, pass gate 201 is enabled and there is a short between nodes IN0 and IN1. Further, if a value in either of memory cells M0 and M7 is upset (i.e., changes to a low value), the path from input terminal IN0 to output terminal OUT is broken, and output signal OUT is no longer actively driven by node IN0. Thus, a single event upset to any of memory cells M0, M1, M6 and M7 causes a failure in the circuit.

However, the circuit is tolerant of single event upsets in four of the eight memory cells. If the value in memory cell M5 is upset (i.e., changes to a high value), pass gates 226 and 205 are inadvertently enabled. However, pass gates 206 and 225 are both disabled, so no inadvertent short is created. Similarly, an upset to memory cell M4 does not cause a short, because pass gates 205 and 224 continue to function properly. An upset to memory cell M3 does not cause a short, because pass gates 204 and 223 continue to function properly. Finally, an upset to memory cell M2 does not cause a short, because pass gates 203 and 222 continue to function properly.

Therefore, the circuit of FIG. 2 is tolerant of upsets in four of the eight memory cells. The susceptibility of the circuit to single event upsets has been reduced by a factor of two. However, when the principles of the invention are applied to larger multiplexer circuits, the susceptibility is reduced even further. Note that no matter how wide the multiplexer (i.e., no matter what the number of input terminals), a single event upset in one of only four memory cells will disrupt the functioning of the circuit. In other words, the circuit of the invention is tolerant of upsets in N–4 (N minus 4) of the memory cells, where N is the number of memory cells. Thus, the multiplexer circuit of the invention reduces the susceptibility to single event upsets by a factor of (N–4)/N compared to the circuit of FIG. 1.

The 8-to-1 multiplexer circuit of FIG. 2 is purely exemplary. Embodiments of the invention can include multiplexers of any size, or combinations of multiplexers some or all of which include the invention. However, there is no advantage to applying the invention to multiplexer circuits that are 4-to-1 or smaller. In a 4-to-1 pass gate multiplexer circuit implemented according to the invention, a single event upset to any of the four memory cells still causes a failure in the circuit.

Figure 1:
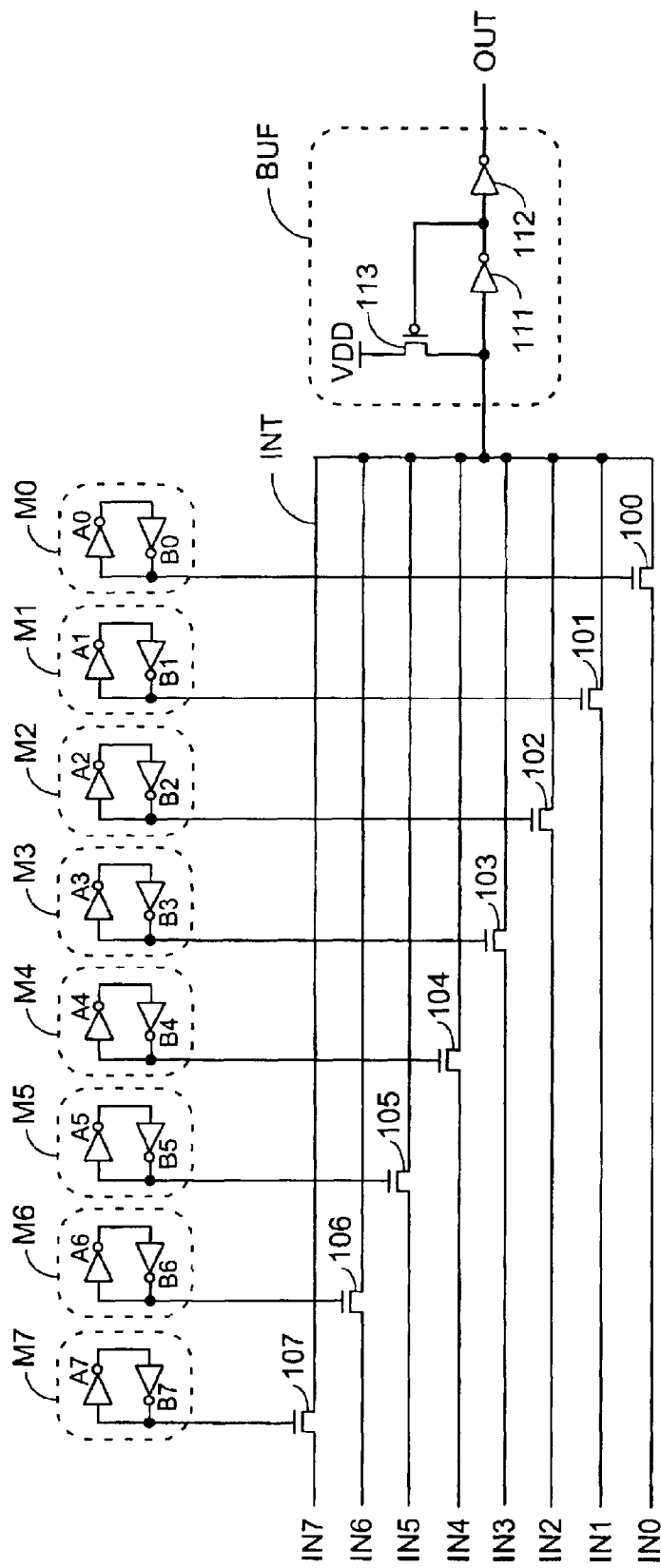
FIG. 1 shows a prior art pass gate multiplexer circuit.

Clearly, the multiplexer circuit of FIG. 2 has a longer path delay than the circuit of FIG. 1, because the selected input path includes two pass gates instead of one. Therefore, the circuit of FIG. 2 is not necessarily suitable for all applications. However, where reducing the susceptibility to single event upsets is a priority, the circuit provides a desirable alternative to prior art multiplexing circuits.

Figure 3:
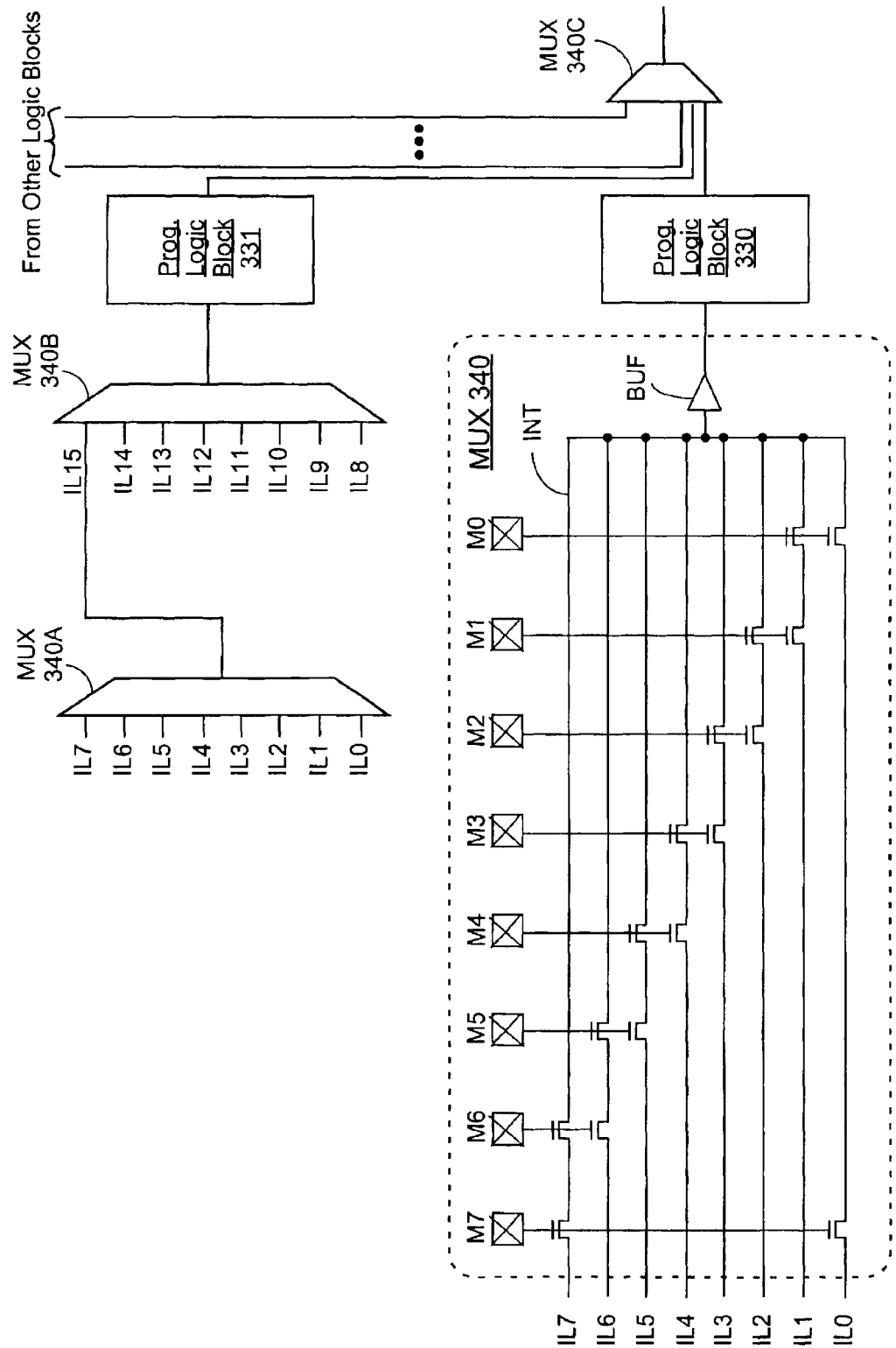
FIG. 3 shows a system according to another embodiment of the invention.

FIG. 3 illustrates another embodiment of the invention, and provides examples of how the circuit of FIG. 2 can be used in a programmable system. The system of FIG. 3 includes a pass gate multiplexer circuit 340 similar to that of FIG. 2. However, the system also includes several other similar circuits 340A, 340B, and 340C, interconnect lines IL0–15, and programmable logic blocks 330 and 331. Each multiplexer circuit selects one of several input signals (either from one of the interconnect lines or one of the logic blocks) and passes the selected signal to another component in the system.

In one embodiment, the system is a programmable logic device (PLD) such as an FPGA, and the pass gate multiplexer circuits are controlled by configuration memory cells of the FPGA.

Those having skill in the relevant arts of the invention will now perceive various modifications and additions that can be made as a result of the disclosure herein. For example, the above text describes the circuits of the invention in the context of field programmable gate arrays (FPGAs) controlled by configuration data stored in static RAM cells. However, the circuits of the invention can also be implemented in other programmable logic devices (PLDs) subject to the effects of single event upsets or other kinds of failures.

Further, pass gates, transistors, pull ups, buffers, memory cells, and other components other than those described herein can be used to implement the circuits of the invention. Active-high signals can be replaced with active-low signals by making straightforward alterations to the circuitry, such as are well known in the art of circuit design. For example, pass gates can be implemented as CMOS pass gates including paired N- and P-channel transistors enabled by a single memory cell. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A system controlled by configuration memory cells susceptible to single event upsets, the system comprising:
   a plurality of programmable logic blocks;
   a plurality of interconnect lines; and
   a plurality of multiplexer circuits programmably coupling the interconnect lines to each other and to the logic blocks, each of the multiplexer circuits comprising:
      a plurality of input terminals;
      an output node;
      a plurality of first pass gates coupled between the plurality of input terminals and the output node, each of the first pass gates having a different associated input terminal and further having a gate terminal;
      a plurality of second pass gates each coupled in series with an associated one of the first pass gates and forming therewith a pass gate pair coupled between the associated input terminal and the output node, each of the second pass gates having a gate terminal; and
      a plurality of configuration memory cells susceptible to the single event upsets, each configuration memory cell having an output terminal coupled to the gate terminals of an associated one of the first pass gates and an associated one of the second pass gates,
      wherein each of the pass gate pairs includes their associated first and second pass gates having gate terminals coupled to different ones of the plurality of configuration memory cells, respectively.

2. The system of claim 1, each of the multiplexer circuits further comprising a buffer having an input terminal, coupled to the output node, and an output terminal.

3. The system of claim 1, wherein each of the multiplexer circuits comprises eight pass gate pairs.

4. The system of claim 1, wherein the first pass gates and the second pass gates comprise N-channel transistors.

5. The system of claim 1, wherein the system comprises a programmable logic device (PLD).

6. The system of claim 5, wherein the PLD is a field programmable gate array (FPGA) and the memory cells are static RAM cells configured with configuration data for the FPGA.

7. The system of claim 1, wherein exactly two of the plurality of configuration memory cells are configured to enable their associated pass gates at any one time.

* * * * *